(12) United States Patent
Delshadpour

(10) Patent No.: US 11,296,737 B1
(45) Date of Patent: Apr. 5, 2022

(54) GAIN CONTROL CIRCUIT FOR LINEAR EQUALIZER WITH PROGRAMMABLE EQUAL STEP PEAKING GAIN

(71) Applicant: NXP B.V., Eindhoven (NL)

(72) Inventor: Siamak Delshadpour, Phoenix, AZ (US)

(73) Assignee: NXP B.V., Eindhoven (NL)

( * ) Notice: Subject to any disclaimer, the term of this patent is extended or adjusted under 35 U.S.C. 154(b) by 50 days.

(21) Appl. No.: 17/086,230

(22) Filed: Oct. 30, 2020

(51) Int. Cl.
| H04B 1/04 | (2006.01) |
| H04L 25/03 | (2006.01) |
| H03G 3/30 | (2006.01) |
| H03M 1/66 | (2006.01) |

(52) U.S. Cl.
CPC ......... *H04B 1/0483* (2013.01); *H03G 3/3036* (2013.01); *H03M 1/66* (2013.01); *H04L 25/03828* (2013.01)

(58) Field of Classification Search
CPC ..... H04B 1/0483; H03G 3/3036; H03M 1/66; H04L 25/03828
USPC ........................................................ 375/232
See application file for complete search history.

(56) References Cited

U.S. PATENT DOCUMENTS

| 5,521,544 | A | * | 5/1996 | Hatanaka | ................. | G06G 7/24 327/356 |
| 6,043,700 | A | * | 3/2000 | Hoang | ..................... | G06G 7/24 327/120 |
| 7,944,382 | B2 | * | 5/2011 | Mateman | .............. | H03M 1/664 341/139 |
| 10,447,507 | B1 | | 10/2019 | Zhang et al. | | |
| 2012/0201289 | A1 | * | 8/2012 | Abdalla | ............ | H04L 25/03057 375/232 |
| 2020/0153395 | A1 | | 5/2020 | Geng et al. | | |

OTHER PUBLICATIONS

U.S. Appl. No. 17/084,494; 26 pages (filed Oct. 29, 2020).
Gondi, Srikanth et al.; "Equalization and Clock and Data Recovery Techniques for 10-GB/s CMOS Serial-Link Receivers"; IEEE Journal of Solid State Circuits, vol. 42, No. 9, Sep. 2007, 13 pgs.
U.S. Appl. No. 16/876,970; 18 pages (filed May 18, 2020).
U.S. Appl. No. 17/084,528; 23 pages (filed Oct. 29, 2020).

* cited by examiner

*Primary Examiner* — Kevin M Burd

(57) ABSTRACT

Embodiments of a gain control circuit and a wideband communication circuit that uses the gain control circuit are disclosed. In an embodiment, gain control circuit includes first and second output terminals to output gain control signals and first and second diode-connected transistors connected between a supply voltage and the first and second output terminals, which are connected to input terminals of a communication component circuit with a plurality of input transistors. The gain control circuit further includes a current digital-to-analog converter connected to the diode-connected transistors to generate first and second currents for the diode-connected transistors based on an N-bit input code, wherein a ratio of the first and second currents sets voltages of the gain control signals that are output from the gain control circuit to the communication component circuit to control signal gain provided by the communication component circuit.

20 Claims, 15 Drawing Sheets

GAIN CONTROL CIRCUIT FOR LINEAR EQUALIZER WITH PROGRAMMABLE EQUAL STEP PEAKING GAIN

BACKGROUND

Wired communication refers to the transmission of data over a wire-based communication technology. In general, wired communications are considered to be the most stable of all types of communications services. Wide band wired data communication systems such as universal serial bus (USB), high-definition multimedia interface (HDMI), DisplayPort (DP), Peripheral Component Interconnect Express (PCIe), Thunderbolt, Converged Input Output (CIO, also known as USB4) and any other high-speed communication applications often include stages of processing within their electronic circuitry.

As data rate increases, a high speed continuous-time linear equalizer (CTLE) with programmable low frequency and high frequency equalizer gain becomes essential in the communication system in order to support various communication channels, e.g. microstrip, coaxial cable with different lengths. However, a conventional CTLE can only change its equalizer gain, defined as the gain difference between the maximum gain across the frequency and the DC gain (low frequency output gain), by varying its DC gain. Thus, an additional gain stage may be needed to adjust the DC gain to the target value. In addition, a conventional CTLE can only provide a certain programmable peaking gain due to the parasitic components of a switch.

SUMMARY

Embodiments of a gain control circuit and a wideband communication circuit that uses the gain control circuit are disclosed. In an embodiment, gain control circuit includes first and second output terminals to output gain control signals and first and second diode-connected transistors connected between a supply voltage and the first and second output terminals, which are connected to input terminals of a communication component circuit with a plurality of input transistors. The gain control circuit further includes a current digital-to-analog converter connected to the first and second diode-connected transistors to generate first and second currents for the first and second diode-connected transistors based on an N-bit input code, wherein a ratio of the first and second currents generated by the current digital-to-analog converter sets voltages of the gain control signals that are output from the gain control circuit to the communication component circuit to control signal gain provided by the communication component circuit.

In an embodiment, the communication component circuit is a continuous-time linear equalizer (CTLE) and the first and second output terminals of the gain control circuit are connected to control terminals of the input transistors of the CTLE.

In an embodiment, the current digital-to-analog converter includes a plurality of current sources that are connected to a plurality of switches and a fixed voltage, the plurality of switches being controlled by the N-bit input code that are applied to the plurality of switches.

In an embodiment, each of the current sources of the current digital-to-analog converter is designed to provide a multiple of a fixed unit of current.

In an embodiment, the gain control circuit further includes a resistor connected between the supply voltage and the first and second diode-connected transistors.

In an embodiment, the gain control circuit further includes a current source connected between the supply voltage and the first and second diode-connected transistors.

In an embodiment, the gain control circuit further includes a first unity gain buffer connected between the first diode-connected transistor and the first output terminal and a second unity gain buffer connected between the second diode-connected transistor and the second output terminal.

In an embodiment, the first and second diode-connected transistors are bipolar transistors.

In an embodiment, the first and second diode-connected transistors are metal-oxide-semiconductor (MOS) transistors.

In an embodiment, a wideband communication circuit includes a gain control circuit with first and second output terminals to output gain control signals, and a continuous-time linear equalizer (CTLE) with a plurality of input transistors connected to the first and second output terminals of the gain control circuit to control gain of input signals by the CTLE. The gain control circuit includes first and second diode-connected transistors connected between a supply voltage and the first and second output terminals, and a current digital-to-analog converter connected to the first and second diode-connected transistors to generate first and second currents for the first and second diode-connected transistors based on an N-bit input code, wherein a ratio of the first and second currents generated by the current digital-to-analog converter sets voltages of the gain control signals that are output from the gain control circuit to the CTLE to control signal gain provided by the CTLE.

In an embodiment, the first and second output terminals of the gain control circuit are connected to control terminals of the input transistors of the CTLE.

In an embodiment, the gain control circuit further includes the current digital-to-analog converter of the gain control circuit includes a plurality of current sources that are connected to a plurality of switches and a fixed voltage, the plurality of switches being controlled by the N-bit input code that are applied to the plurality of switches.

In an embodiment, each of the current sources of the current digital-to-analog converter is designed to provide a multiple of a fixed unit of current.

In an embodiment, the gain control circuit further includes a resistor connected between the supply voltage and the first and second diode-connected transistors.

In an embodiment, the gain control circuit further includes a current source connected between the supply voltage and the first and second diode-connected transistors.

In an embodiment, the gain control circuit further includes a first unity gain buffer connected between the first diode-connected transistor and the first output terminal and a second unity gain buffer connected between the second diode-connected transistor and the second output terminal.

In an embodiment, the first and second diode-connected transistors of the gain control circuit are bipolar transistors.

In an embodiment, the first and second diode-connected transistors of the gain control circuit are metal-oxide-semiconductor (MOS) transistors.

In an embodiment, a gain control circuit includes first and second output terminals to output gain control signals, and first and second diode-connected transistors connected between a supply voltage and the first and second output terminals. The output terminals of the gain control circuit are connected to input terminals of a continuous-time linear equalizer (CTLE) with a plurality of input transistors. The gain control circuit further includes first and second unity gain buffers connected between the first and second diode-connected transistors and the first and second output terminals, and a current digital-to-analog converter connected to the first and second diode-connected transistors to generate first and second currents for the first and second diode-connected transistors based on an N-bit input code, wherein a ratio of the first and second currents generated by the current digital-to-analog converter sets voltages of the gain control signals that are output from the gain control circuit to the CTLE to control signal gain provided by the CTLE.

In an embodiment, the gain control circuit further includes a resistor or a current source connected between the supply voltage and the first and second diode-connected transistors.

These and other aspects in accordance with embodiments will become apparent from the following detailed description, taken in conjunction with the accompanying drawings, illustrated by way of example of the principles of the embodiments.

BRIEF DESCRIPTION OF THE DRAWINGS

Throughout the description, similar reference numbers may be used to identify similar elements.

DETAILED DESCRIPTION

It will be readily understood that the components of the embodiments as generally described herein and illustrated in the appended Figs. could be arranged and designed in a wide variety of different configurations. Thus, the following more detailed description of various embodiments, as represented in the Figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the embodiments is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment", "an embodiment", or similar language means that a particular feature, structure, or characteristic described in connection with the indicated embodiment is included in at least one embodiment of the present invention. Thus, the phrases "in one embodiment", "in an embodiment", and similar language throughout this specification may, but do not necessarily, all refer to the same embodiment.

Figure 1:
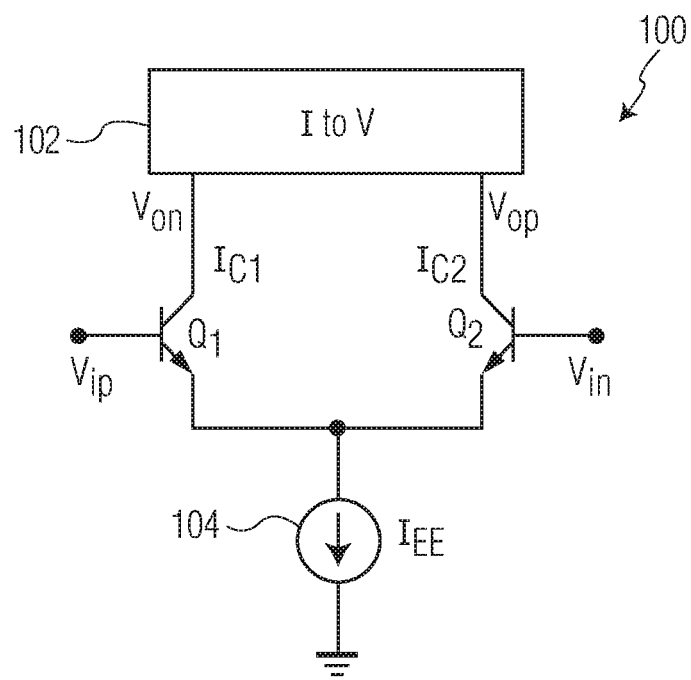
FIG. 1 shows a bipolar differential pair circuit in accordance with prior art that can be used as a basis for a continuous-time linear equalizer (CTLE) design.

FIG. 1 illustrates a bipolar differential pair circuit 100 in accordance with prior art that can be used as a basis for a continuous-time linear equalizer design. The bipolar differential pair circuit 100 includes a current-to-voltage converter 102, a pair of bipolar transistors $Q_1$ and $Q_2$ and a current source 104 that provides current $I_{EE}$. From large signal analysis of such a bipolar differential pair circuit, voltage and current equations for the bipolar differential pair circuit 100 can be expressed as:

$$V_{ip} - V_{in} = V_D \tag{1}$$

$$I_{C1} + I_{C2} = I_{EE} \tag{2}$$

$$I_{C1} = I_{EE}/(1 + \exp(-V_D/V_T)) \tag{3}$$

$$I_{C2} = I_{EE}/(1 + \exp(V_D/V_T)). \tag{4}$$

When $V_D > 4V_T$ (~104 mV), the majority of current $I_{EE}$ goes to the transistor $Q_1$, and when $V_D < -4V_T$, the majority of current $I_{EE}$ goes to the transistor $Q_2$.

Figure 2:
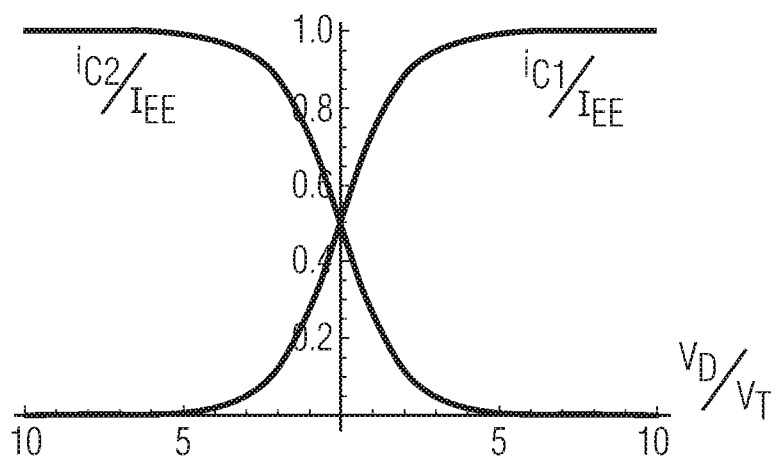
FIG. 2 shows currents $I_{C1}$ and $I_{C2}$ in the bipolar differential pair circuit depicted in FIG. 1 normalized to $I_{EE}$ versus $V_D/V_T$.

FIG. 2 shows currents $I_{C1}$ and $I_{C2}$ in the bipolar differential pair circuit 100 normalized to $I_{EE}$ versus $V_D/V_T$. As shown in FIG. 2, the linear range of the bipolar differential pair circuit 100 is very small and the "$-4V_T$ to $+4V_T$" range is not linear. The actual linear range is within $\pm V_T$. This means that a more sophisticated scheme is needed to have a linear control over the currents $I_{C1}$ and $I_{C2}$.

Figure 3:
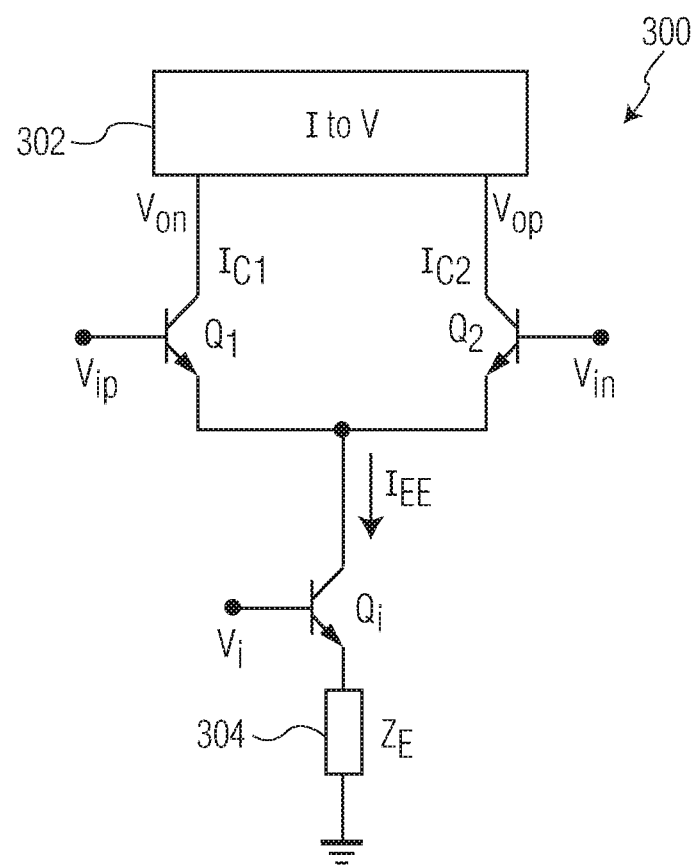
FIG. 3 shows a single core CTLE based on the bipolar differential pair circuit depicted in FIG. 1 in accordance with prior art.

FIG. 3 shows a single core continuous-time linear equalizer (CTLE) 300 based on the bipolar differential pair circuit 100 in accordance with prior art. As shown in FIG. 3, the single core CTLE 300 includes a current-to-voltage converter 302, a pair of bipolar transistors $Q_1$ and $Q_2$, a transistor $Q_1$ that functions as a current source to provide current $I_{EE}$, and an impedance element 304 having an impedance value of $Z_E$. The circuit diagram of the single core CTLE 300 shown in FIG. 3 illustrates generation of the current $I_{EE}$ using an input voltage $V_i$, which can be expressed as:

$$I_{EE} \sim I_{CQi} \sim V_i/(r_{\pi i} + Z_E), \tag{5}$$

where $I_{CQi}$ is the current at the collector of the transistor $Q_1$ and $r_{\pi i}$ is the internal resistance of the transistor $Q_i$ from the base to the emitter. The input signal $V_i$ is an alternating current (AC) signal, which is the incoming high-speed signal that needs to be equalized by the CTLE 300, and the impedance $Z_E$ can be a high-order (RLC) impedance, where $V_D = V_{ip} - V_{in}$ and a direct current (DC) voltage will control its $I_{C1}$ and $I_{C2}$ portions (for detail regarding high order CTLEs, see U.S. patent application Ser. No. 16/876,970, titled "Continuous Time Linear Equalization Circuit", which is incorporated herein by reference). Depending on the circuit design strategy, the current-to-voltage converter 302 can be a simple resistor termination or may utilize more complicated methods/loads (such as capacitive or inductive loads).

Figure 4:
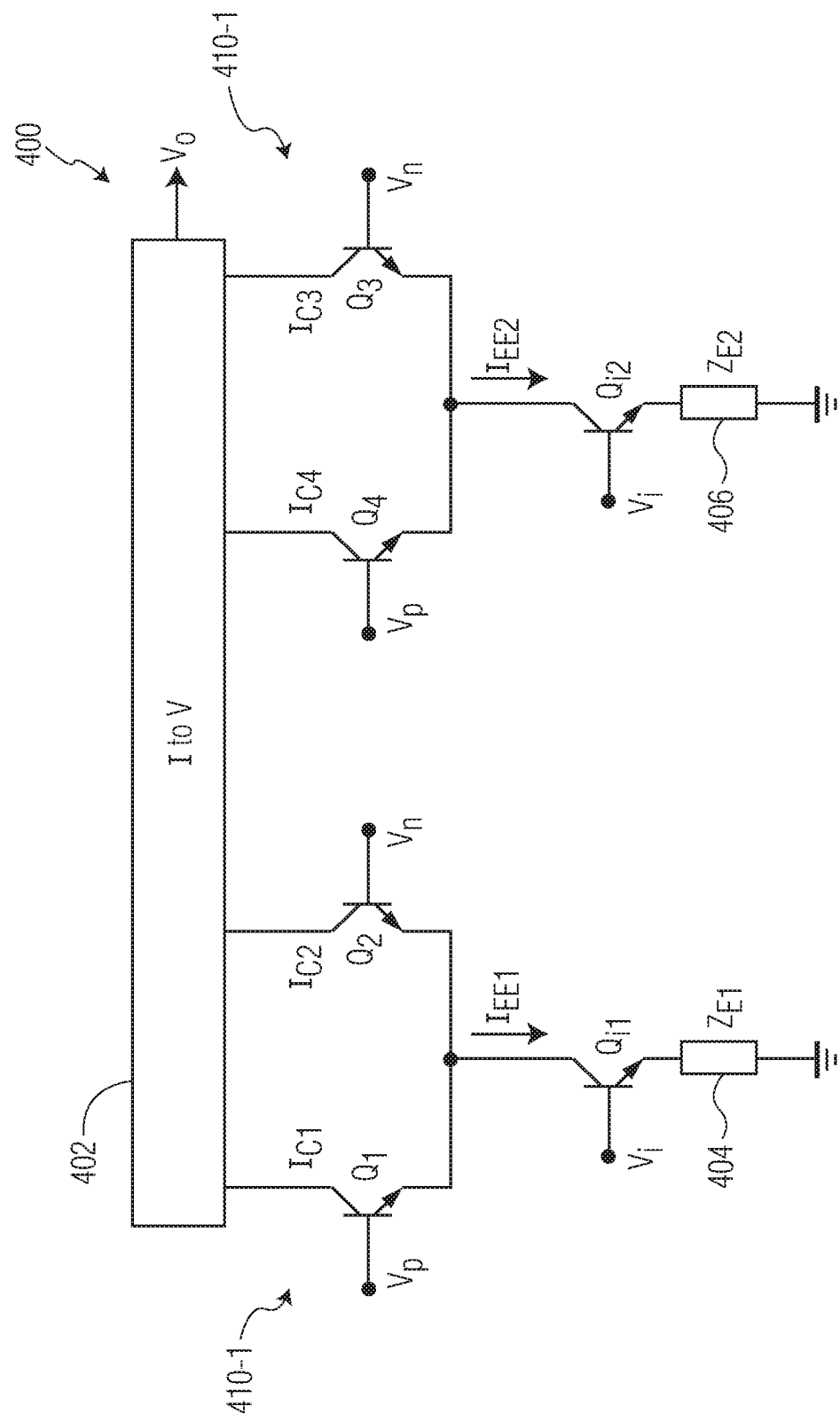
FIG. 4 shows a two core CTLE, which is an expansion of the single core CTLE depicted in FIG. 3, in accordance with prior art.

FIG. 4 shows a two core CTLE 400, which is an expansion of the single core CTLE 300 depicted in FIG. 3, in accordance with prior art. As shown in FIG. 4, the two core CTLE 400 includes a current-to-voltage converter 402, and first and second core circuits 410-1 and 410-2. The first core circuit 410-1 includes a pair of bipolar transistors $Q_1$ and $Q_2$, a transistor $Q_{i1}$ that functions as a current source to provide current $I_{EE1}$, and an impedance element 404 having an impedance value of $Z_{E1}$. Similarly, the second core circuit 410-2 includes a pair of bipolar transistors $Q_3$ and $Q_4$, a transistor $Q_{i2}$ that functions as a current source to provide current $I_{EE2}$, and an impedance element 406 having an impedance value of $Z_{E2}$.

The current equation for each core of the two core CTLE 400 is similar to the current equation for the single core CTLE 300 depicted in FIG. 3. The current equation for each core of the two core CTLE 400 is as follows:

$$I_{EE1} \sim I_{CQi1} \sim V_i/(r_{\pi i1} + Z_{E1}) \tag{6}$$

$$I_{EE2} \sim I_{CQi2} \sim V_i/(r_{\pi i2} + Z_{E2}), \tag{7}$$

where $I_{CQi1}$ is the collector current for the transistor $Q_{i1}$, $I_{CQi2}$ is the collector current for the transistor $Q_{i2}$, $r_{\pi i1}$ is the internal resistance of the transistor $Q_{i1}$ from the base to the emitter and $r_{\pi i2}$ is the internal resistance of the transistor $Q_{i2}$ from the base to the emitter. The input signal $V_i$ is an AC signal and the impedance $Z_{E1}$ and/or the impedance $Z_{E2}$ can be a high-order (RLC) impedance, where $V_D = V_p - V_n$ and a DC voltage will control the "$I_{C1} - I_{C2}$" and "$I_{C3} - I_{C4}$" portions.

The current-to-voltage convertor 402 should combine currents $I_{C1}$, $I_{C2}$, $I_{C2}$ and $I_{C4}$ in a way that when $V_D = V_p - V_n \ll -4_{VT}$, then:

$$V_o/V_i \sim 1/(r_{\pi 1} + Z_{E1}) \tag{8}$$

and when $V_D = V_p - V_n \gg 4_{VT}$, then then:

$$V_o/V_i \sim 1/(r_{\pi 2} + Z_{E2}). \tag{9}$$

The current-to-voltage convertor 402 should also act like a combination of semi-linear form in the middle range so that when $-4_{VT} < V_p - V_n < 4_{VT}$, then:

$$V_o/V_i \sim \alpha/(r_{\pi i1} + Z_{E1}) + (1-\alpha)/(r_{\pi i2} + Z_{E2}). \tag{10}$$

Figure 5:
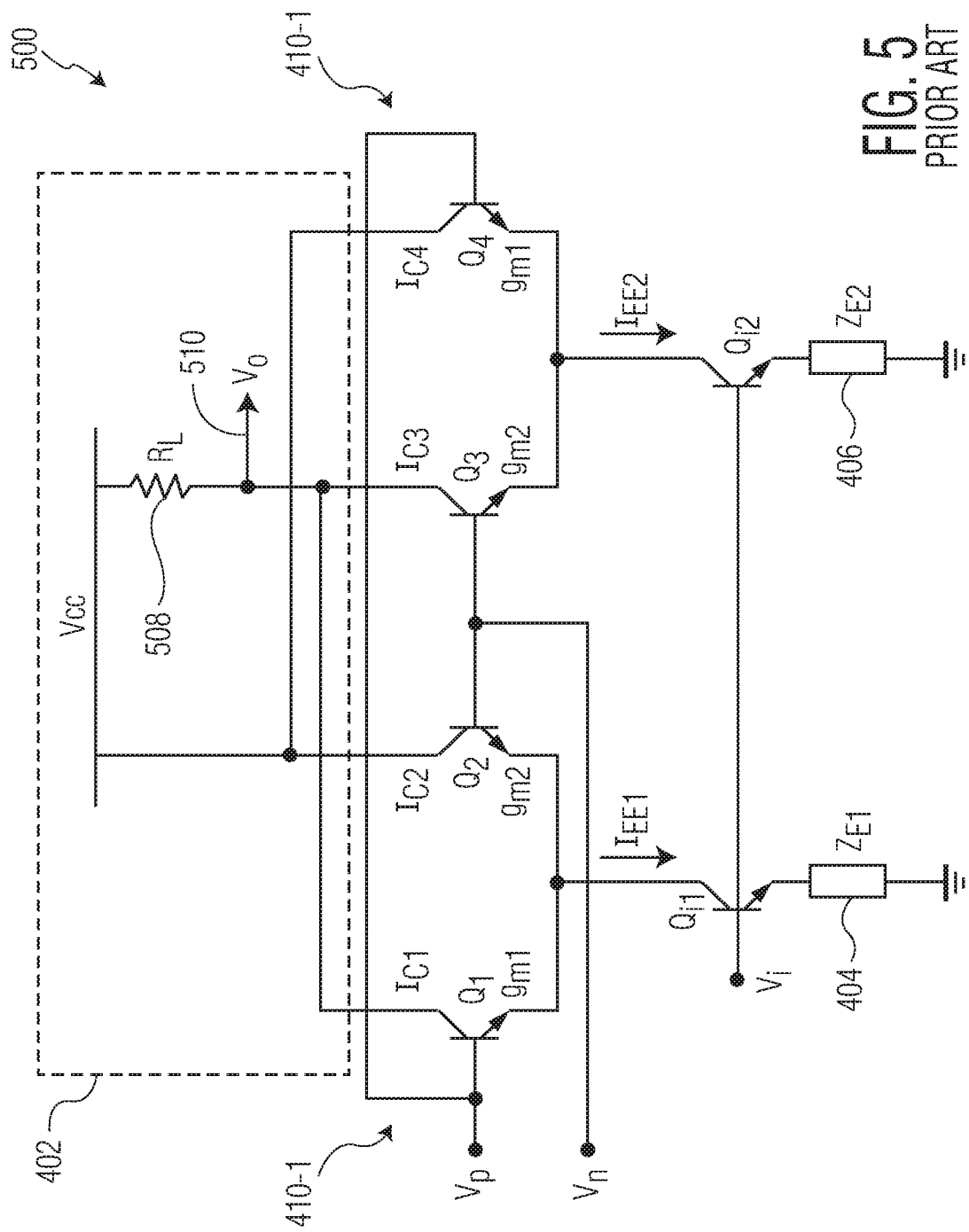
FIG. 5 shows a more complete differential two core CTLE in accordance with prior art.

Turning now to FIG. 5, a more complete differential two core CTLE 500 in accordance with prior art is shown. As shown in FIG. 5, the current-to-voltage convertor 402, which combines two differential pairs of transistors, is shown in more detail. The current-to-voltage convertor 402 includes a resistor 508 with a resistance value of $R_L$, which is connected to a supply voltage $V_{CC}$ and to the transistors $Q_1$ and $Q_3$. Also shown in FIG. 5 is an output terminal 510, which is connected to a node between the resistor 508 and the transistors $Q_1$ and $Q_3$. Also illustrated in FIG. 5 is the transconductance value of each of the transistors $Q_1$, $Q_2$, $Q_3$ and $Q_4$. Specifically, each of the transistors $Q_1$ and $Q_4$ has a transconductance of $g_{m1}$, and each of the transistors $Q_2$ and $Q_3$ has a transconductance of $g_{m2}$.

In a single ended form, $V_i$ is the input signal and $V_o$ is the output signal, where $V_o/V_i$ can be expressed in terms of transistor currents or their transconductance $g_m$ as follows:

$$\frac{V_o}{V_i} = \frac{I_{C1} R_L}{V_T + I_{EE1} Z_{E1}} + \frac{I_{C2} R_L}{V_T + I_{EE2} Z_{E2}} \tag{11}$$

$$\frac{V_o}{V_i} = \frac{g_{m1} R_L}{1 + (g_{m1} + g_{m2}) Z_{E1}} + \frac{g_{m2} R_L}{1 + (g_{m1} + g_{m2}) Z_{E2}} \tag{12}$$

For a fixed maximum CTLE peaking gain, $g_{m1}$ will stay at its minimum value and $g_{m2}$ will stay at its maximum value. It has been assumed that $I_{EE1} = I_{EE2}$ to have $g_{m1} + g_{m2} =$ Constant in the two cores. The fully differential implementation of the two core CTLE 500 depicted in FIG. 5 illustrates this simple requirement in a more clear form.

To have a programmable gain CTLE with equal gain steps, e.g. N-bit programmability, "$g_{m1}$ & $g_{m2}$" should change linearly. To have the $g_{m1}$ and $g_{m2}$ linear, due to exponential nature of $I_C$ versus $V_{base}$ of a BJT, $V_p$ and $V_n$ need to be in logarithmic form to achieve a linear $I_{C1}$ and $I_{C2}$, which results in equally linear $g_{m1}$ and $g_{m2}$. This is hard to achieve without using a logarithmic form for output of a digital-to-analog converter (DAC).

Figure 6A:
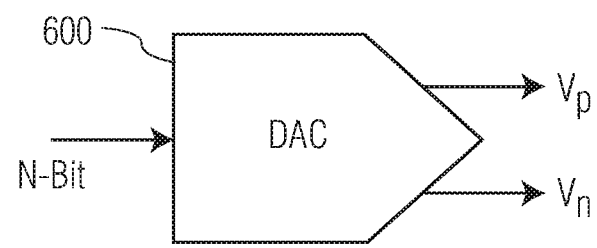
FIG. 6A shows a voltage digital-to-analog (DAC) converter with N-bit control that can provide outputs signals $V_p$ and $V_n$ for a CTLE, such as the two core CTLE depicted in FIG. 5, which can be used as a basis for a gain control circuit in accordance with embodiments of the invention.
Figure 6B:
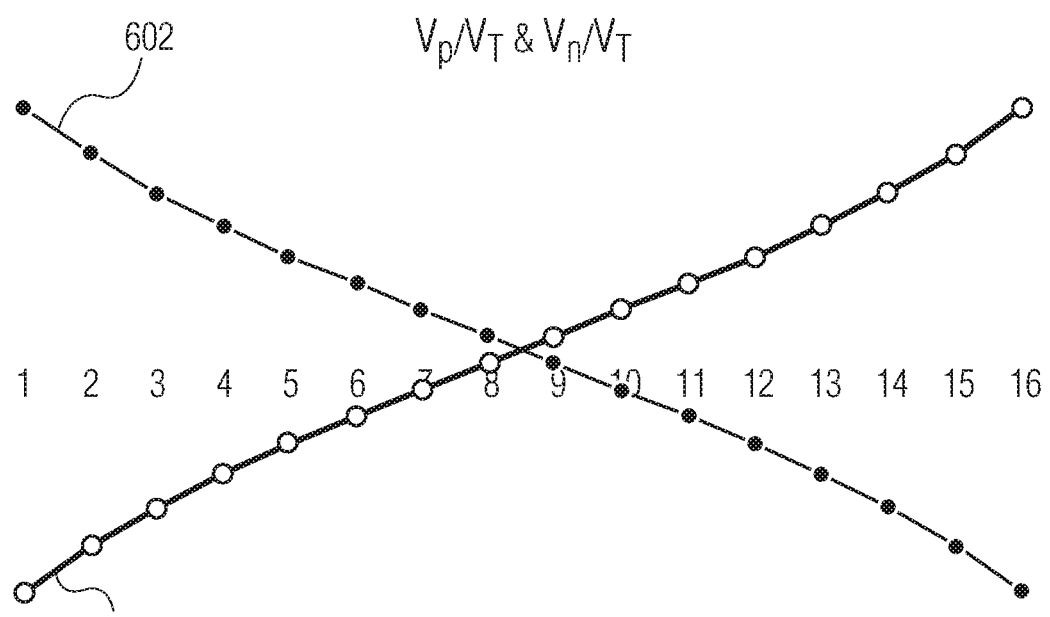
FIG. 6B is a graph showing the $V_p/V_T$ curve and the $V_n/V_T$ curve versus digital input code for the voltage DAC depicted in FIG. 6A.
Figure 6C:
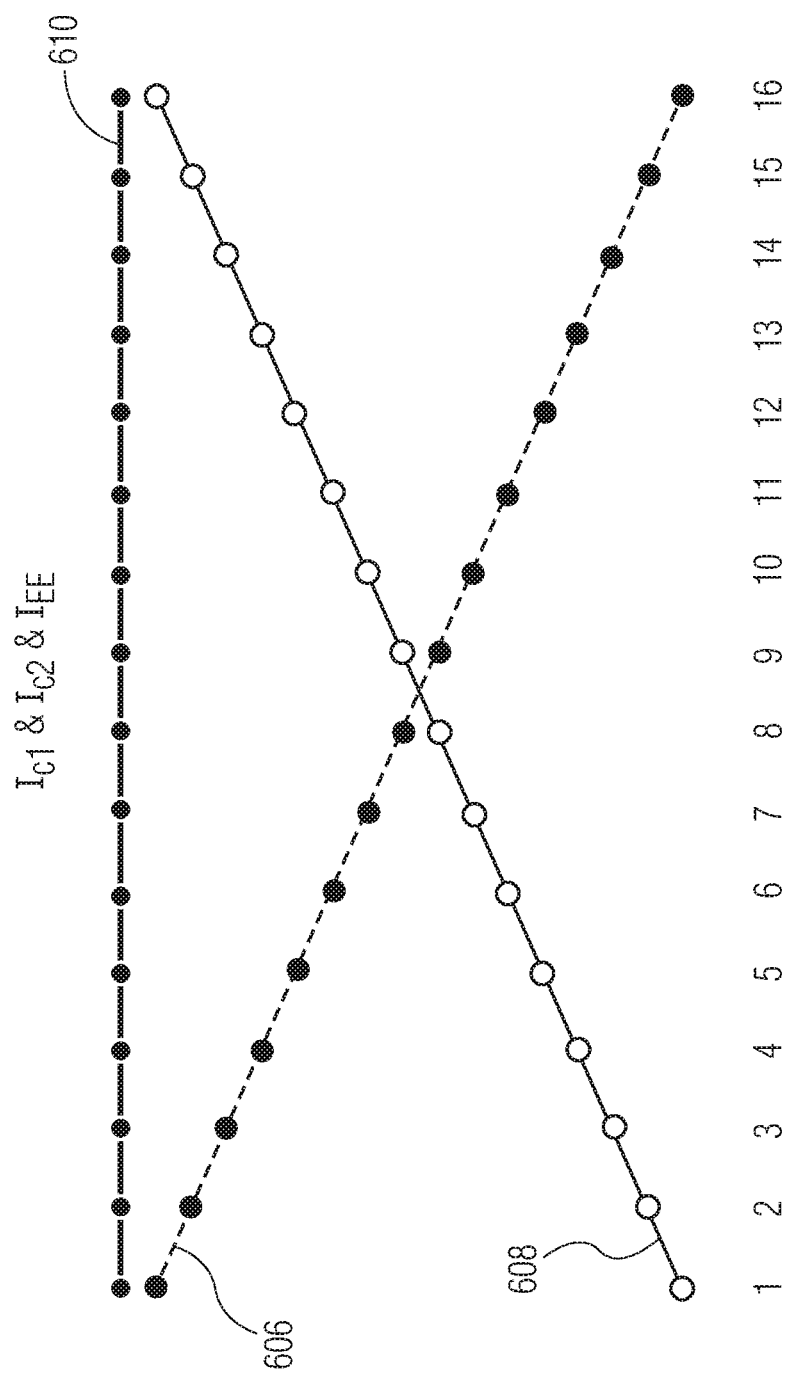
FIG. 6C is a graph showing the currents $I_{C1}$, $I_{C2}$ and $I_{EE}$ (which equals $I_{C1}+I_{C2}$) versus digital input code for the voltage DAC depicted in FIG. 6A.

FIG. 6A shows a voltage digital-to-analog (DAC) converter 600 with N-bit control that can provide outputs signals $V_p$ and $V_n$ for a CTLE, such as the two core CTLE 500 depicted in FIG. 5, which can be used as a basis for a gain control circuit in accordance with embodiments of the invention. FIG. 6B is a graph showing the $V_p/V_T$ curve 602 and the $V_n/V_T$ curve 604 versus digital input code (N=4, equal 16 steps/codes) for the voltage DAC 600. FIG. 6C is a graph showing the currents $I_{C1}$ 606, $I_{C2}$ 608 and $I_{EE}$ 610 (which equals $I_{C1}+I_{C2}$) versus digital input code for the voltage DAC 600. When the voltage DAC 600 is used to provide the signals $V_p$ and $V_n$ for the two core CTLE 500, $V_D=V_p-V_n$ is a DC voltage and will define the weight of each of the $g_{m1}$ and $g_{m2}$, while $g_{m1}+g_{m2}=G_m$ is constant and stay constant. Different weights will define different CTLE peaking gain.

A problem with using the voltage DAC 600 for the two core CTLE 500 is that the entire linear range is limited (i.e., $\pm 4V_T$, see equations (3) and (4)). Using the voltage DAC 600, to have different gain steps, e.g., in a 4-bit scheme, $2^4=16$ steps, $\pm 4V_T/2^4 = \pm V_T/4 \sim \pm 6$ mV, which is fairly small. In addition, even after making such a voltage DAC, setting $V_p$ and $V_n$ values, which are highly PVT dependent, may be challenging.

Figure 7A:
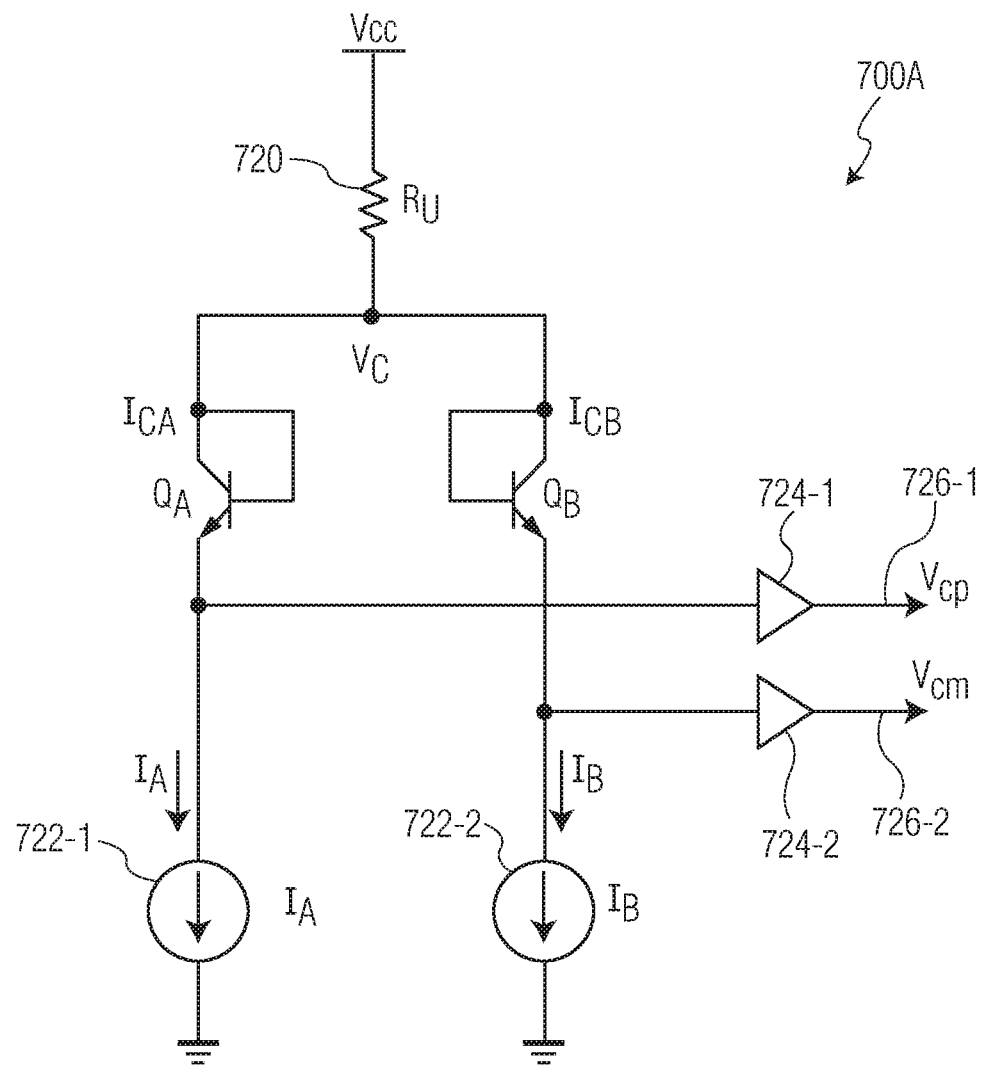
FIG. 7A shows a gain control circuit in bipolar junction transistor (BJT) form, which is designed as a logarithmic amplifier, that can be used for a CTLE, such as the two core CTLE depicted in FIG. 5, in accordance with a first embodiment of the invention.

Turning now to FIG. 7A, a gain control circuit 700A in bipolar junction transistor (BJT) form, which is designed as a logarithmic amplifier, that can be used for a CTLE, such as the two core CTLE 500, in accordance with a first embodiment of the invention is shown. The gain control circuit 700A includes a resistor 720 with a resistance value of Ru, transistors $Q_A$ and $Q_B$, current sources 722-1 and 722-2 that provide currents $I_A$ and $I_B$, respectively, and unity gain buffers 724-1 and 724-2. The resistor 720 is connected to a supply voltage $V_{CC}$ and the collectors of the transistors $Q_A$ and $Q_B$. The emitter of the transistor $Q_A$ is connected to the current source 722-1, which is connected to a fixed voltage, e.g., ground. Similarly, the emitter of the transistor $Q_B$ is connected to the current source 722-2, which is connected to a fixed voltage, e.g., ground. The bases of the transistors $Q_A$ and $Q_B$ are connected to their respective collectors, and thus, these transistors are diode-connected transistors. The unity gain buffer 724-1 is connected to a node between the transistor $Q_A$ and the current source 722-1. The output of the unity gain buffer 724-1 is connected to an output terminal 726-1 of the gain control circuit 700A. Similarly, the unity gain buffer 724-2 is connected to a node between the transistor $Q_B$ and the current source 722-2. The output of the unity gain buffer 724-2 is connected to an output terminal 726-2 of the gain control circuit 700A. In some implementations, the unity gain buffers 724-1 and 724-2 may be omitted.

For the gain control circuit 700A, the base-to-emitter voltage of the transistor $Q_A$ ($V_{BE,QA}$) and the base-to-emitter voltage of the transistor $Q_B$ ($V_{BE,QB}$) can be expressed as follows:

$$V_{BE,QA} = V_T \ln(I_A/I_S) \quad (13)$$

$$V_{BE,QB} = V_T \ln(I_B/I_S). \quad (14)$$

As a result, the base-to-emitter voltage of the transistor $Q_A$ minus the base-to-emitter voltage of the transistor $Q_B$ can be expressed as follows:

$$V_{BE,QA} - V_{BE,QB} = V_T \ln(I_A/I_B). \quad (15)$$

Since the base voltage of the transistor $Q_A$ ($V_{B,QA}$) and the base voltage of the transistor $Q_B$ ($V_{B,QB}$) each equals $V_C$, or $V_{B,QA}=V_{B,QB}=V_C$, then:

$$V_{BE,QA} - V_{BE,QB} = V_{E,QA} - V_{E,QB}. \quad (16)$$

In addition, considering the unity gain buffers 724-1 and 724-2 connected to the emitters of the transistors $Q_A$ and $Q_B$, the output voltages $V_{cp}$ and $V_{cn}$ can be expressed as:

$$V_{cp} - V_{cn} = V_T \ln(I_A/I_B). \quad (17)$$

Figure 7B:
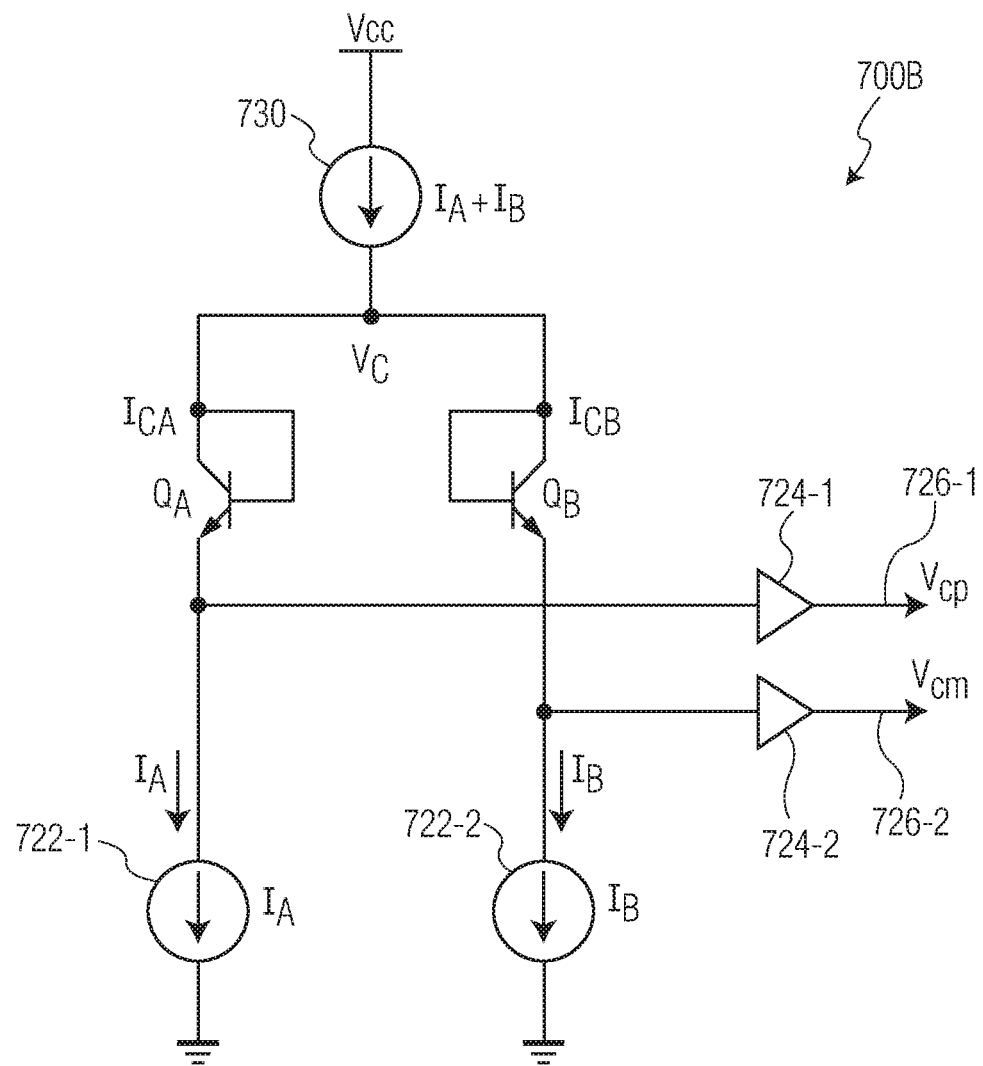
FIG. 7B shows a gain control circuit, which is designed as a logarithmic amplifier, that can be used for a CTLE, such as the two core CTLE depicted in FIG. 5, in accordance with a second embodiment.

A gain control circuit 700B, which is designed as a logarithmic amplifier, that can be used for a CTLE, such as the two core CTLE 500, in accordance with a second embodiment is shown in FIG. 7B. The gain control circuit 700B is similar to the gain control circuit 700A shown in FIG. 7A. However, in this embodiment, instead of the resistor 720, a current source 730 that provides current $I_A+I_B$ is used. Ratio of $I_A/I_B$ defines the $V_D=V_{cp}-V_{cn}$ voltage as is seen in equation (17).

Figure 8A:
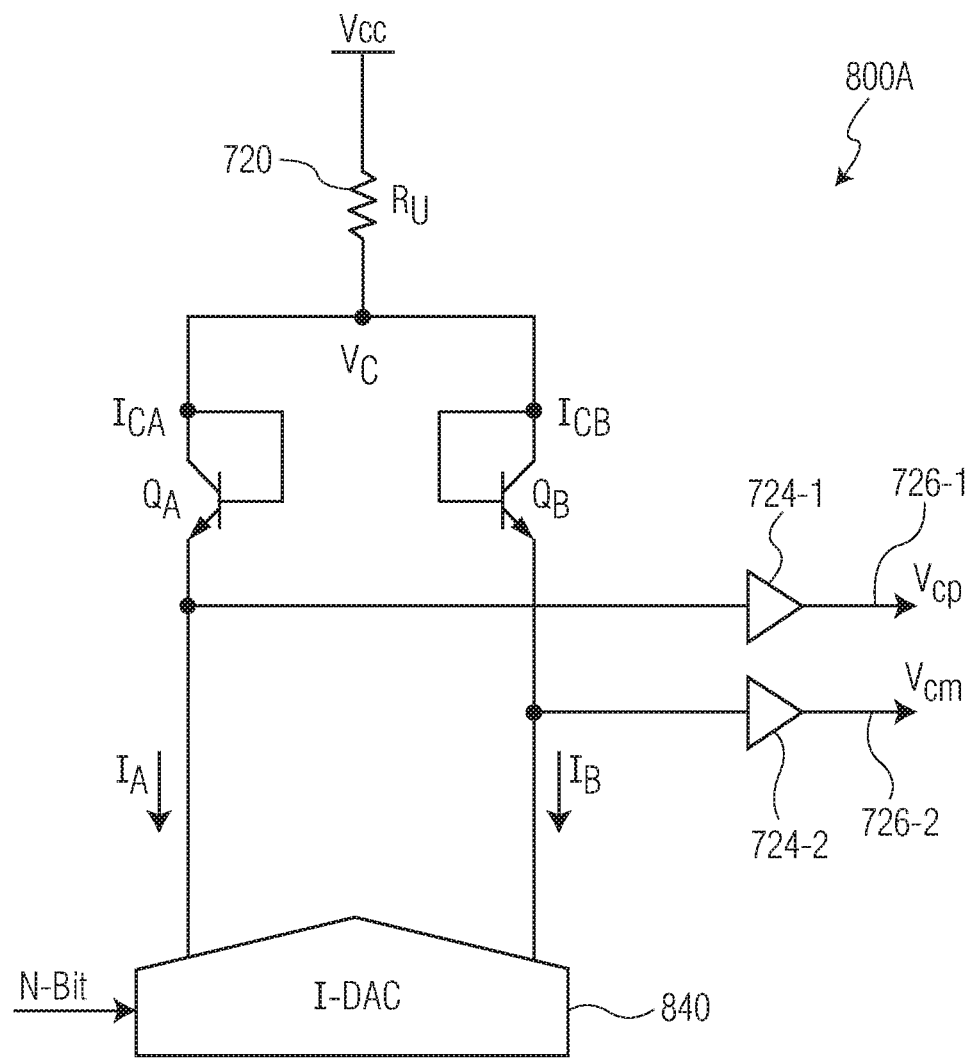
FIG. 8A shows a gain control circuit, which is an implementation of the gain control circuit depicted in FIG. 7A using a current DAC, in accordance with a first embodiment of the invention.
Figure 8B:
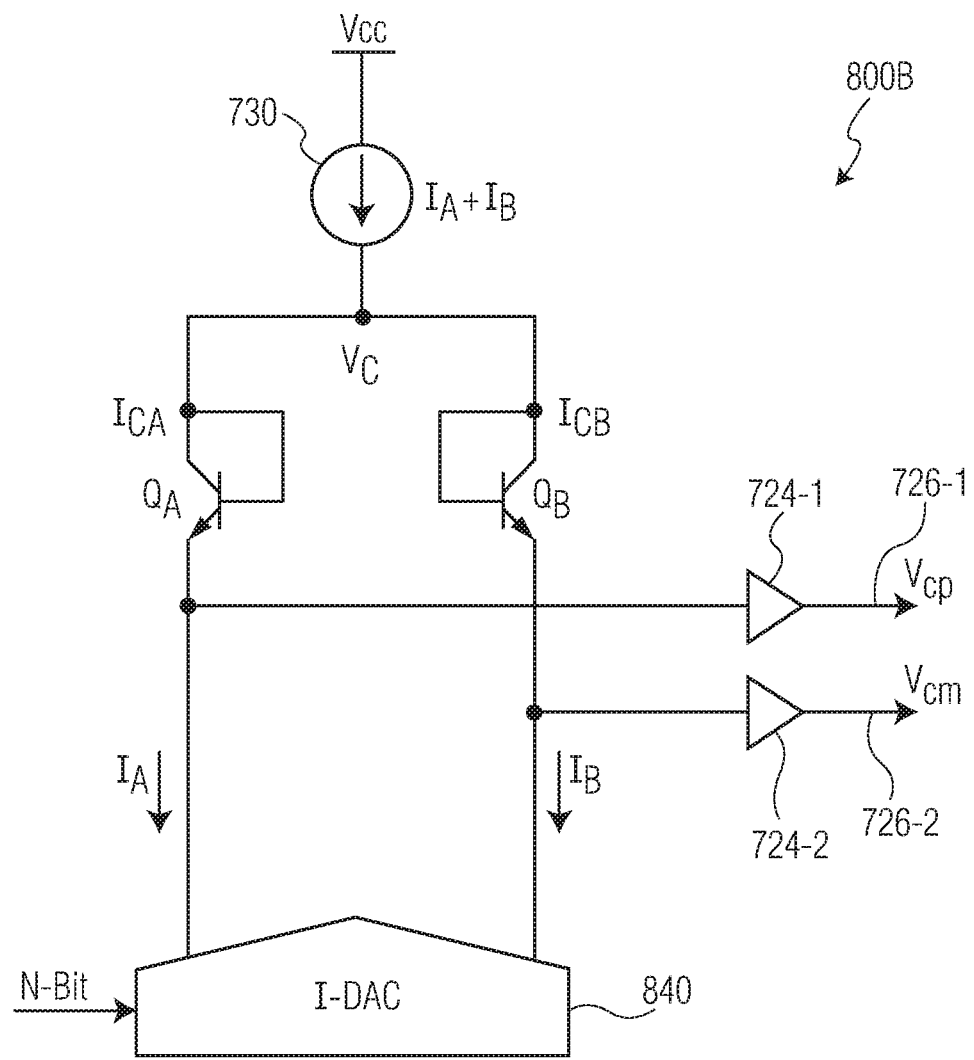
FIG. 8B shows a gain control circuit, which is an implementation of the gain control circuit depicted in FIG. 7B using a current DAC, in accordance with a second embodiment of the invention.

Turning now to FIG. 8A, a gain control circuit 800A, which is an implementation of the gain control circuit 700A depicted in FIG. 7A using a current DAC 840, in accordance with a first embodiment of the invention is shown. As illustrated in FIG. 8A, the current sources 722-1 and 722-2 of the gain control circuit 700A have been replaced by the current DAC 840, which does not need to be logarithmic, as explained above. A monotonic shape of a linear DAC will provide the needed $V_{cp}$ and $V_{cn}$ voltages based on equation (17). FIG. 8B shows a gain control circuit 800B, which is an implementation of the gain control circuit 700B depicted in FIG. 7B using the current DAC 840, in accordance with a second embodiment of the invention is shown in FIG. 8B. It is noted here that the gain control circuit 800A depicted in FIG. 8A with the resistor 720 needs less headroom and is more proper for low voltage applications.

Figure 9:
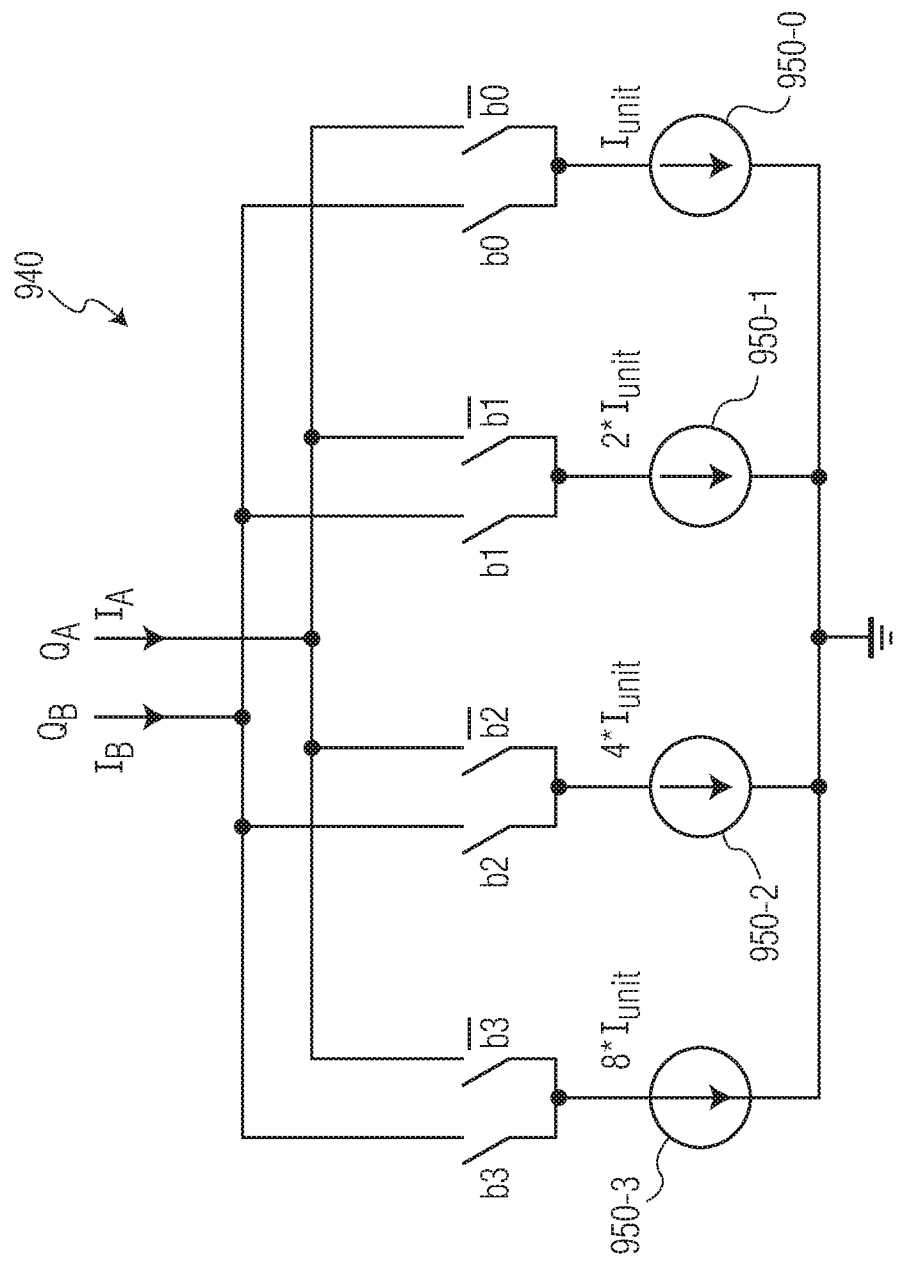
FIG. 9 shows a current DAC that can be used in the gain control circuit depicted in FIG. 8A or FIG. 8B in accordance with embodiments of the invention.

FIG. 9 is a circuit diagram of a current DAC 940 that can be used in the gain control circuit 800A or 800B in accordance with embodiments of the invention. The current DAC 940 is a 4-bit current DAC, which means that a 4-bit codes is used to generate the desired currents $I_A$ and $I_B$. However, in other embodiments, the current DAC 940 can be designed to receive an N-bit code, where N is smaller or greater than 4, depending on the required number of gain steps for the CTLE, to get the required resolution with respect to the generated currents $I_A$ and $I_B$.

As shown in FIG. 9, the current DAC 940 includes four pairs of switches b0, $\overline{b0}$, b1, $\overline{b1}$, b2, $\overline{b2}$, b3, and $\overline{b3}$, and four current sources 950-0, 950-1, 950-2 and 950-2 that provide currents $I_{unit}$, $2*I_{unit}$, $4*I_{unit}$ and $8*I_{unit}$, respectively. Thus, each of these current sources provides a multiple of a fixed unit of current $I_{unit}$. These switches and current sources are connected between the transistors $Q_A$ and $Q_B$ of the gain control circuit 800A or 800B and a fixed voltage, e.g., ground. In particular, the switches $\overline{b0}$, $\overline{b1}$, $\overline{b2}$ and $\overline{b3}$ are connected between the transistors $Q_A$ and the current sources 950-0, 950-1, 950-2 and 950-2, respectively. Similarly, the switches b0, b1, b2 and b3 are connected between the transistors $Q_B$ and the current sources 950-0, 950-1, 950-2 and 950-2, respectively. The switches b0, $\overline{b0}$, b1, $\overline{b1}$, b2, $\overline{b2}$, b3, and $\overline{b3}$ are selectively turned on or off by 4-bit codes.

Considering $I_{unit}$ as a unit current:

$$I_A+I_B=(2^4-1)I_{unit} \quad (18)$$

$$I_B = b_3*2^3 I_{unit} + b_2*2^2 I_{unit} + b_1*2^2 I_{unit} + b_0*2^0 I_{unit} \quad (19)$$

$$I_A = (2^4-1)I_{unit} - I_B \quad (20)$$

Using these equations, the currents $I_A$ and $I_B$ can be controlled by 4-bit codes.

Figure 10:
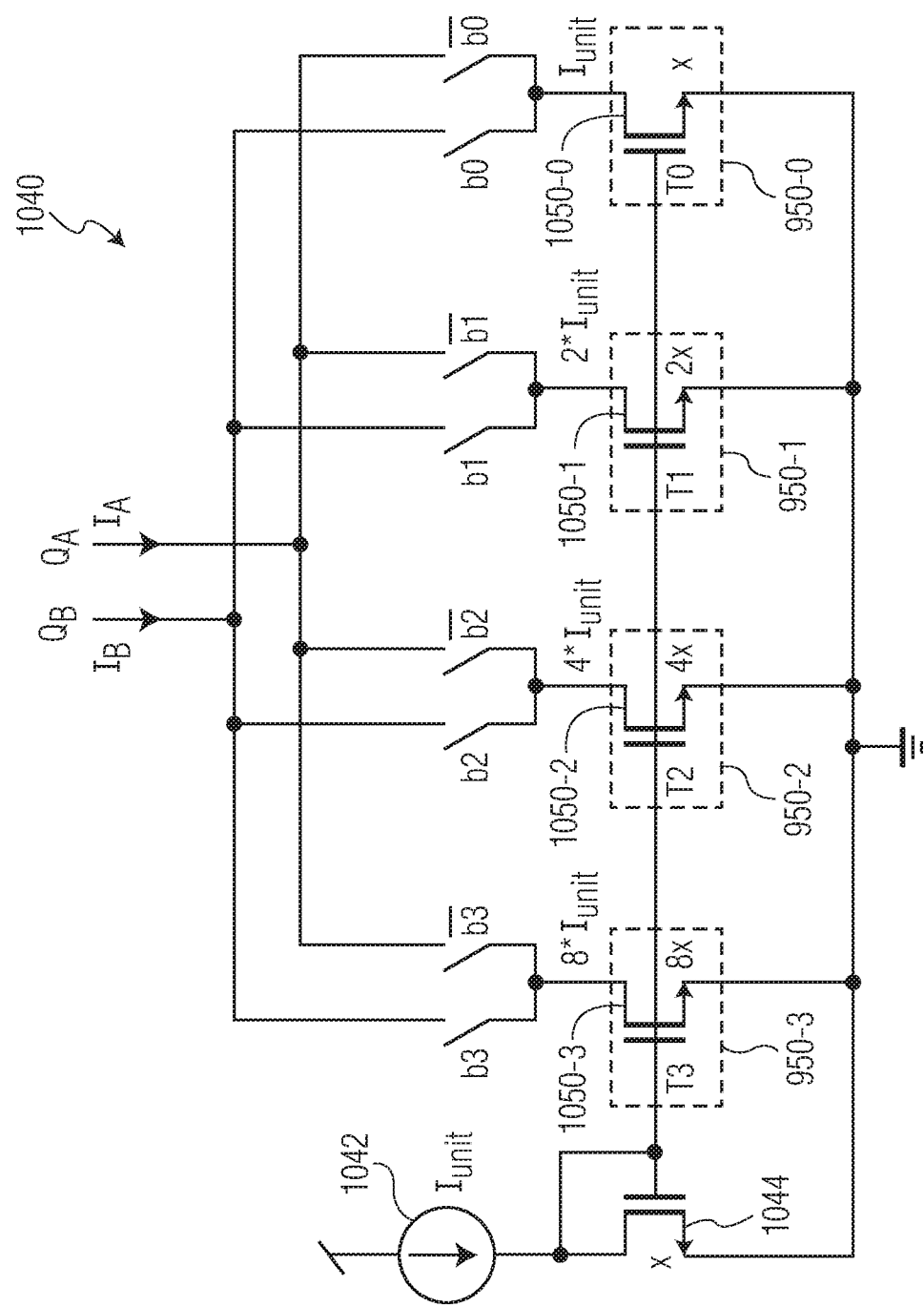
FIG. 10 shows a current DAC in a metal-oxide-semiconductor (MOS) implementation that can be used in the gain control circuit depicted in FIG. 8A or FIG. 8B in accordance with embodiments of the invention.

Turning now to FIG. 10, a current DAC 1040 in a metal-oxide-semiconductor (MOS) implementation that can be used in the gain control circuit 800A or 800B in accordance with embodiments of the invention is shown. As depicted in FIG. 10, the current DAC 1040 includes transistors 1050-0, 1050-1, 1050-2 and 1050-3, which are employed as the current sources 950-0, 950-1, 950-2 and 950-2, respectively. The current DAC 1040 further includes a current source 1042 that provides current $I_{unit}$ and a reference transistor 1044 with its gate connected to its drain. The gate of the reference transistor 1044 is connected to the gates of the transistors 1050-0, 1050-1, 1050-2 and 1050-3.

In the current DAC 1040, the transistors 1050-0, 1050-1, 1050-2 and 1050-3 generate the desired currents $I_A$ and $I_B$. The output current of each transistor is scaled according to the size of each device. Changing bits of "$b_3b_2b_1b_0$" from "0000" toward "1111", changes value of $I_A$ and $I_B$ while "$I_A+I_B$" is constant. The current DAC 1040 may also be implemented using BJT technology.

Figure 11:
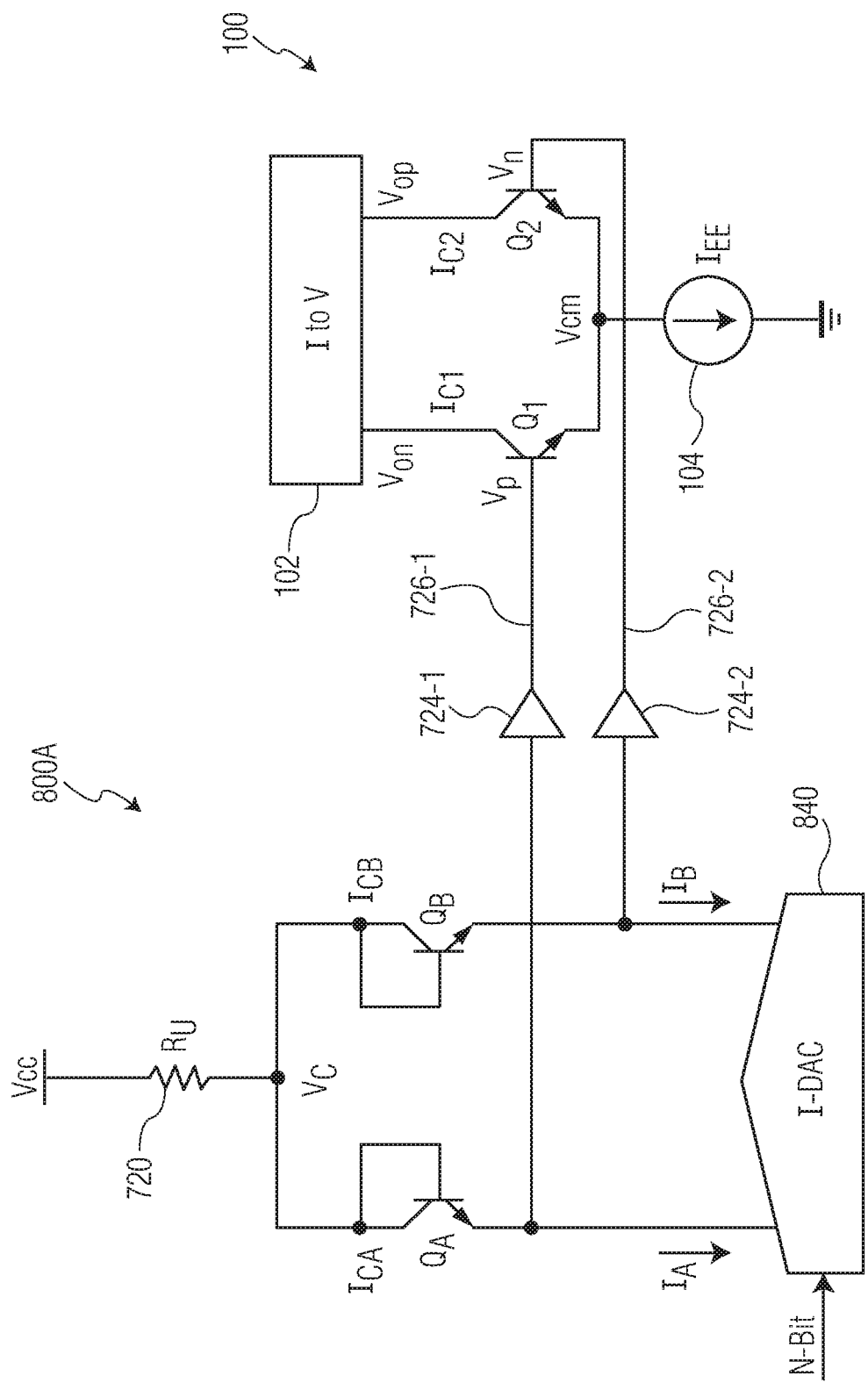
FIG. 11 shows the gain control circuit depicted in FIG. 9A being used to control the bipolar differential pair circuit depicted in FIG. 1 in accordance with an embodiment of the invention.

FIG. 11 shows the gain control circuit 800A being used to control the bipolar differential pair circuit 100 in accordance with an embodiment of the invention. From equation (1), it is known that:

$$V_D = V_p - V_n = V_T \ln(I_A/I_B), \quad (21)$$

which results in:

$$I_{C1} = I_{EE}/(1+\exp(-V_D/V_T)) = I_{EE}/(1+I_B/I_A) = I_A(I_{EE}/(I_A+I_B)) = \alpha I_A \quad (22)$$

$$I_{C2} = I_{EE}/(1+\exp(V_D/V_T)) = I_{EE}/(1+I_A/I_B) = I_B(I_{EE}/(I_A+I_B)) = \alpha I_B \quad (23)$$

Figure 12:
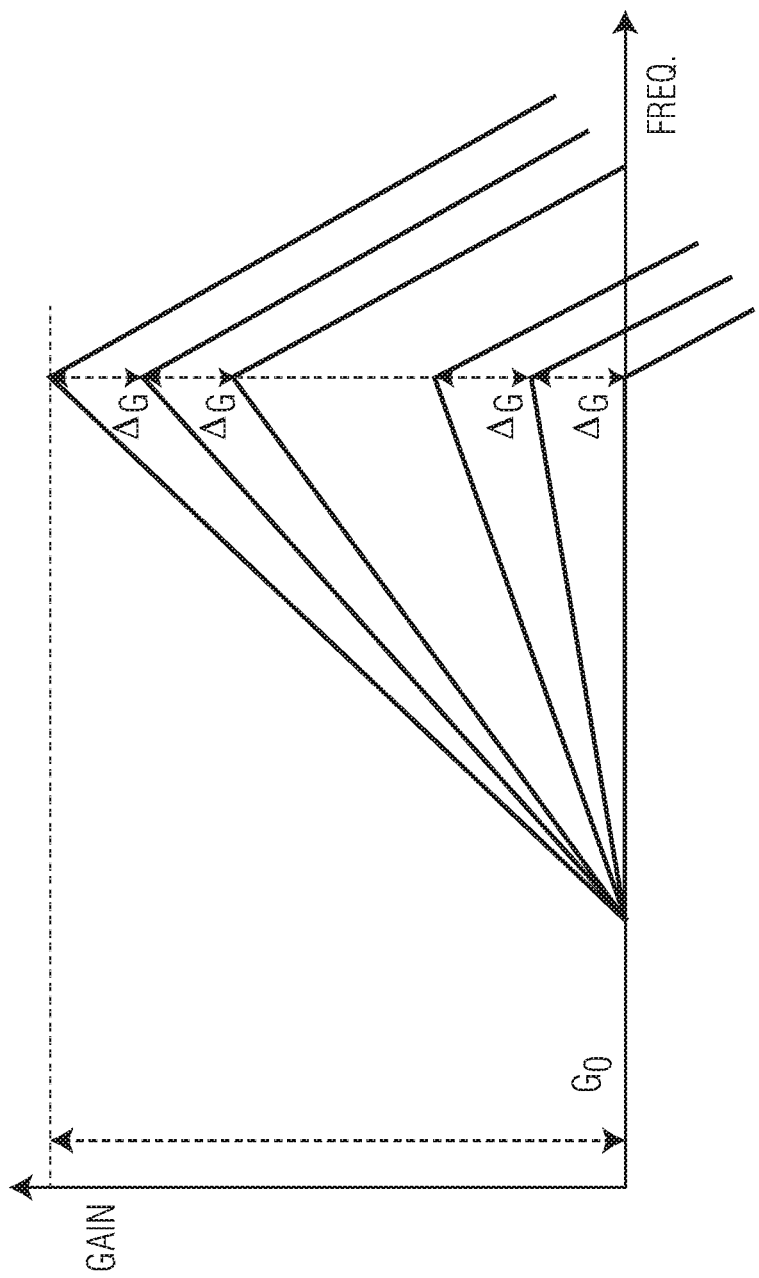
FIG. 12 is a graph illustrating different gain curves of the two core CTLE depicted in FIG. 5 using the gain control circuit depicted in FIG. 8A.

This means a linear transformation from an N-bit current DAC 840 to $I_{C1}$ and $I_{C2}$ (equally $g_{m1}$ and $g_{m2}$) is happening. Choosing the size of the transistors $Q_A$ and $Q_B$ and their current to right scale of the transistors $Q_1$ and $Q_2$ provide the right matching for minimum PVT variation of the final CTLE peaking gain. This make the linear steps on CTLE peaking gain possible. Control of "$V_D = V_p - V_n$" without using the offered scheme is difficult due to the needed "ln" (logarithmic) nature of voltage to get linear $I_{C1}/I_{C2}$ steps. The gain control circuit 800A provides the logarithmic and linear voltages and currents, which was illustrated in FIG. 6. The gain control circuit 800A can also be connected in a similar manner to a wideband communication components circuit, such as a CTLE, for example, the two core CTLE 500, to provide the logarithmic and linear voltages and currents. FIG. 12 is a graph illustrating different gain curves of the two core CTLE 500 using the gain control circuit 800A. The linearly programmable $g_{m1}$ and $g_{m2}$ provides linearly controlled equal step gains of the CTLE, as illustrated in FIG. 12, without the need of switchable components (e.g., resistors or capacitors that are commonly used in traditional CTLE gain control methods).

Figure 13:
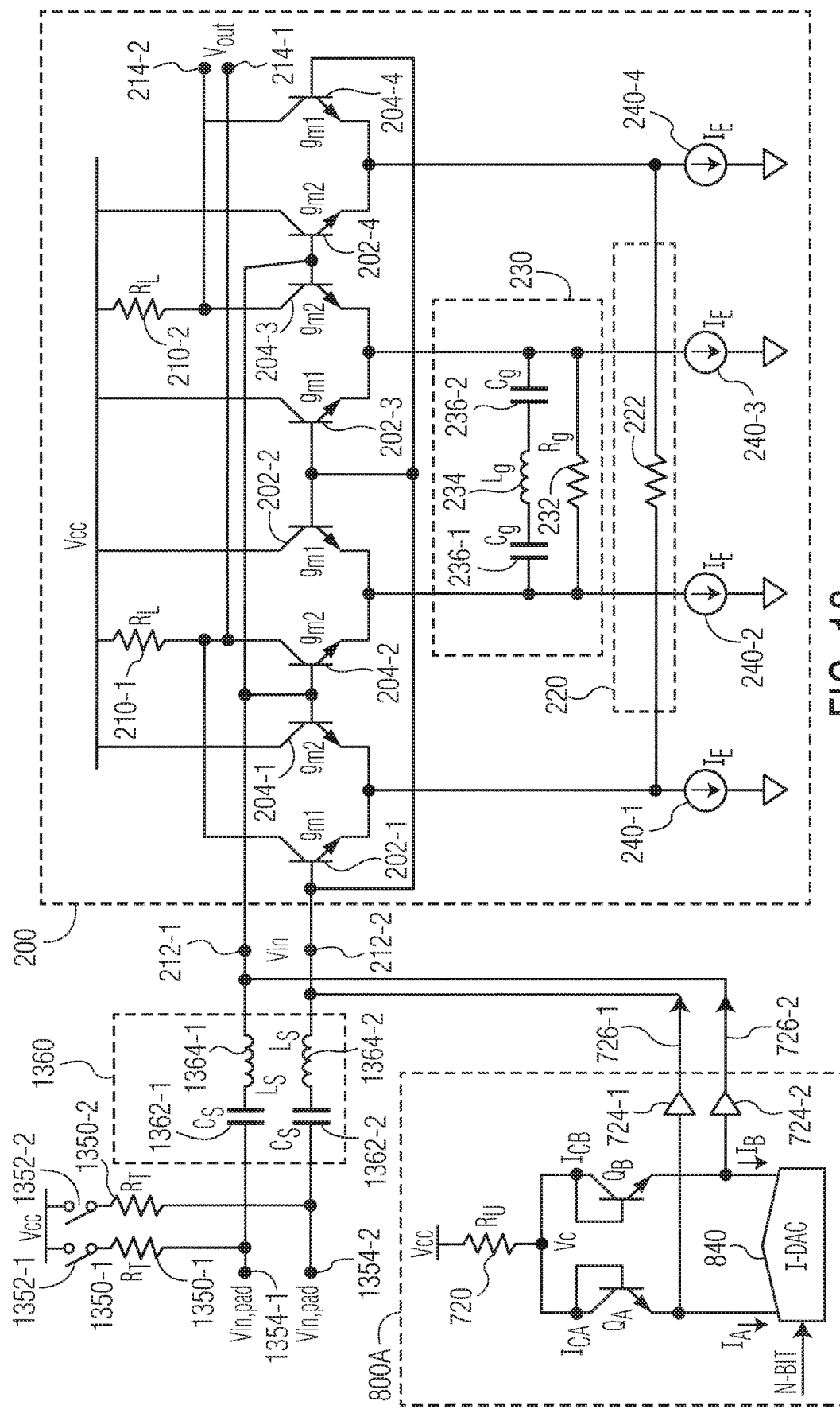
FIG. 13 shows the gain control circuit depicted in FIG. 8A being used with a two-dimensional CTLE in accordance with an embodiment of the invention.

The gain control circuit described herein in accordance with various embodiments of the invention may be used with two-dimensional CTLEs. As an example, as illustrated in FIG. 13, the gain control circuit 800A may be used with a two-dimensional CTLE 200 disclosed in U.S. Pat. No. 10,447,507, entitled "LOW SUPPLY LINEAR EQUALIZER WITH PROGRAMMABLE PEAKING GAIN", which is incorporated herein by reference.

As shown in FIG. 13, the CTLE 200 includes input terminals 212-1 and 212-2 and output terminals 214-1 and 214-2. The input terminal 212-1 is connected to the bases of transistors 204-1, 204-2, 204-3 and 204-4, while the input terminal 212-2 is connected to the bases of transistors 202-1, 202-2, 202-3 and 202-4. The CTLE 200 further includes a resistor 210-1 that is connected to a supply voltage $V_{CC}$ and the collectors of the transistors 202-1 and 204-2, and a resistor 210-2 that is connected to the supply voltage VCC and the collectors of the transistors 204-3 and 204-4. The output terminal 210-1 is connected to a node between the resistor 210-1 and the transistors 202-1 and 204-2. Similarly, the output terminal 210-2 is connected to a node between the resistor 210-2 and the transistors 204-3 and 204-4.

The CTLE 200 further includes current sources 240-1, 240-2, 240-3 and 240-4 that are selectively connected to the emitters of the transistors 202-1, 202-2, 202-3, 202-4, 204-1, 204-2, 204-3 and 204-4 and a fixed voltage, e.g., ground. The CTLE 200 also includes a first impedance element 220 and a second impedance element 230. The first impedance element 220 includes a resistor 222, which is connected to the current sources 240-1 and 240-4. The second impedance element 230 includes a resistor connected to the current sources 240-2 and 240-3, and an inductor 234 and capacitors 236-1 and 236-2 that are connected in series between the current sources 240-2 and 240-3.

As shown in FIG. 13, the output terminals 726-1 and 726-2 of the gain control circuit 800A are connected to the input terminals 212-1 and 212-2 of the CTLE 200. Also shown in FIG. 13 are termination resistors 1350-1 and 1350-2 and associates switches 1352-1 and 1352-2 that are connected to a supply voltage $V_{CC}$ and input pads 1354-1 and 1354-2, which are connected to the input terminals 212-1 and 212-2 of the CTLE 200 via a buffer circuit 1360. The buffer circuit 1360 includes a capacitor 1362-1 and an inductor 1364-1 that are connected in series between the input pad 1354-1 and the input terminal 212-1 of the CTLE, and a capacitor 1362-2 and an inductor 1364-2 that are connected in series between the input pad 1354-2 and the input terminal 212-2 of the CTLE. Since the output of the gain control circuit 800A is connected to the input terminals 212-1 and 212-2 of the CTLE 200s, which are connected to the bases of the 202-1, 202-2, 202-3, 202-4, 204-1, 204-2, 204-3 and 204-4, the gain control circuit 800A is able control the signal gain provided by the CTLE 200.

As another example, the gain control circuit described herein in accordance with various embodiments of the invention may be used with a two-dimensional CTLE disclosed in U.S. patent application Ser. No. 17/084,528, entitled "TWO-DIMENSIONAL CONTINUOUS-TIME LINEAR EQUALIZER FOR HIGH-SPEED APPLICATIONS", which is also incorporated herein by reference.

Although various circuits, including the gain control circuits 800A and 800B, have been described and illustrated as being implemented using BJT technology with bipolar transistors, these circuits may be similarly implemented using complementary metal-oxide-semiconductor (CMOS) technology with MOS transistors.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

It can also be noted that at least some of the operations for the methods described herein may be implemented using software instructions stored on a computer useable storage medium for execution by a computer. As an example, an embodiment of a computer program product includes a computer useable storage medium to store a computer readable program.

The computer-useable or computer-readable storage medium can be an electronic, magnetic, optical, electromagnetic, infrared, or semiconductor system (or apparatus or device). Examples of non-transitory computer-useable and computer-readable storage media include a semiconductor or solid-state memory, magnetic tape, a removable computer diskette, a random-access memory (RAM), a read-only memory (ROM), a rigid magnetic disk, and an optical disk. Current examples of optical disks include a compact disk with read only memory (CD-ROM), a compact disk with read/write (CD-R/W), and a digital video disk (DVD).

Alternatively, embodiments of the invention may be implemented entirely in hardware or in an implementation containing both hardware and software elements. In embodiments that use software, the software may include but is not limited to firmware, resident software, microcode, etc.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A gain control circuit comprising:
   first and second output terminals to output gain control signals;
   first and second diode-connected transistors connected between a supply voltage and the first and second output terminals, the output terminals of the gain control circuit being connected to input terminals of a communication component circuit with a plurality of input transistors; and
   a current digital-to-analog converter connected to the first and second diode-connected transistors to generate first and second currents for the first and second diode-connected transistors based on an N-bit input code, wherein a ratio of the first and second currents generated by the current digital-to-analog converter sets voltages of the gain control signals that are output from the gain control circuit to the communication component circuit to control signal gain provided by the communication component circuit.

2. The gain control circuit of claim 1, wherein the communication component circuit is a continuous-time linear equalizer (CTLE) and wherein the first and second output terminals of the gain control circuit are connected to control terminals of the input transistors of the CTLE.

3. The gain control circuit of claim 1, wherein the current digital-to-analog converter includes a plurality of current sources that are connected to a plurality of switches and a fixed voltage, the plurality of switches being controlled by the N-bit input code that are applied to the plurality of switches.

4. The gain control circuit of claim 3, wherein each of the current sources of the current digital-to-analog converter is designed to provide a multiple of a fixed unit of current.

5. The gain control circuit of claim 1, further comprising a resistor connected between the supply voltage and the first and second diode-connected transistors.

6. The gain control circuit of claim 1, further comprising a current source connected between the supply voltage and the first and second diode-connected transistors.

7. The gain control circuit of claim 1, further comprising a first unity gain buffer connected between the first diode-connected transistor and the first output terminal and a second unity gain buffer connected between the second diode-connected transistor and the second output terminal.

8. The gain control circuit of claim 1, wherein the first and second diode-connected transistors are bipolar transistors.

9. The gain control circuit of claim 1, wherein the first and second diode-connected transistors are metal-oxide-semiconductor (MOS) transistors.

10. A wideband communication circuit comprising:
    a gain control circuit with first and second output terminals to output gain control signals; and
    a continuous-time linear equalizer (CTLE) with a plurality of input transistors connected to the first and second output terminals of the gain control circuit to control gain of input signals by the CTLE,
    wherein the gain control circuit comprises:
       first and second diode-connected transistors connected between a supply voltage and the first and second output terminals; and
       a current digital-to-analog converter connected to the first and second diode-connected transistors to generate first and second currents for the first and second diode-connected transistors based on an N-bit input code, wherein a ratio of the first and second currents generated by the current digital-to-analog converter sets voltages of the gain control signals that are output from the gain control circuit to the CTLE to control signal gain provided by the CTLE.

11. The wideband communication circuit of claim 10, wherein the first and second output terminals of the gain control circuit are connected to control terminals of the input transistors of the CTLE.

12. The wideband communication circuit of claim 10, wherein the current digital-to-analog converter of the gain control circuit includes a plurality of current sources that are connected to a plurality of switches and a fixed voltage, the plurality of switches being controlled by the N-bit input code that are applied to the plurality of switches.

13. The wideband communication circuit of claim 12, wherein each of the current sources of the current digital-to-analog converter is designed to provide a multiple of a fixed unit of current.

14. The wideband communication circuit of claim 10, wherein the gain control circuit further comprises a resistor connected between the supply voltage and the first and second diode-connected transistors.

15. The wideband communication circuit of claim 10, wherein the gain control circuit further comprises a current source connected between the supply voltage and the first and second diode-connected transistors.

16. The wideband communication circuit of claim 10, wherein the gain control circuit further comprises a first unity gain buffer connected between the first diode-connected transistor and the first output terminal and a second unity gain buffer connected between the second diode-connected transistor and the second output terminal.

17. The wideband communication circuit of claim 10, wherein the first and second diode-connected transistors of the gain control circuit are bipolar transistors.

18. The wideband communication circuit of claim 10, wherein the first and second diode-connected transistors of the gain control circuit are metal-oxide-semiconductor (MOS) transistors.

19. A gain control circuit comprising:
    first and second output terminals to output gain control signals;
    first and second diode-connected transistors connected between a supply voltage and the first and second output terminals, the output terminals of the gain control circuit being connected to input terminals of a continuous-time linear equalizer (CTLE) with a plurality of input transistors;

first and second unity gain buffers connected between the first and second diode-connected transistors and the first and second output terminals; and a current digital-to-analog converter connected to the first and second diode-connected transistors to generate first and second currents for the first and second diode-connected transistors based on an N-bit input code, wherein a ratio of the first and second currents generated by the current digital-to-analog converter sets voltages of the gain control signals that are output from the gain control circuit to the CTLE to control signal gain provided by the CTLE.

20. The gain control circuit of claim 19, further comprising a resistor or a current source connected between the supply voltage and the first and second diode-connected transistors.

* * * * *